United States Patent
Zhou et al.

(10) Patent No.: US 10,249,648 B2
(45) Date of Patent: Apr. 2, 2019

(54) MANUFACTURING METHODS OF ARRAY SUBSTRATES AND ARRAY SUBSTRATES

(71) Applicant: Shenzhen China Star Optoelectronics Technology Co., Ltd., Shenzhen, Guangdong (CN)

(72) Inventors: Zhichao Zhou, Guangdong (CN); Hui Xia, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 218 days.

(21) Appl. No.: 15/117,446

(22) PCT Filed: Jul. 20, 2016

(86) PCT No.: PCT/CN2016/090583
§ 371 (c)(1),
(2) Date: Aug. 8, 2016

(87) PCT Pub. No.: WO2018/000477
PCT Pub. Date: Jan. 4, 2018

(65) Prior Publication Data
US 2018/0204852 A1 Jul. 19, 2018

(30) Foreign Application Priority Data
Jun. 27, 2016 (CN) .......................... 2016 1 0479540

(51) Int. Cl.
*H01L 27/12* (2006.01)
*G02F 1/1368* (2006.01)
*H01L 21/77* (2017.01)

(52) U.S. Cl.
CPC .......... *H01L 27/124* (2013.01); *G02F 1/1368* (2013.01); *H01L 21/77* (2013.01);
(Continued)

(58) Field of Classification Search
CPC ............. H01L 27/1244; H01L 27/3297; H01L 27/3248; H01L 27/3276–27/3279; H01L 27/3253
See application file for complete search history.

(56) References Cited

U.S. PATENT DOCUMENTS 9,478,562 B2 10/2016 Long et al.
9,812,541 B2 11/2017 Yuan
(Continued)

FOREIGN PATENT DOCUMENTS

| CN | 103441128 A | 12/2013 |
| CN | 103887328 A | 6/2014 |
| CN | 101097871 A | 1/2018 |

*Primary Examiner* — Changhyun Yi
(74) *Attorney, Agent, or Firm* — Andrew C. Cheng

(57) ABSTRACT

The present disclosure relates to an array substrate and the manufacturing method thereof. The manufacturing method includes the steps including: forming a buffer layer on a substrate, forming a source and a data line within the buffer layer, and forming a gate and a gate line on the buffer layer, forming an insulation layer on the source, the data line, the gate, and the gate line, forming a semiconductor layer on the source, and forming a first pixel electrode and a second pixel electrode on the insulation layer. The manufacturing efficiency of the manufacturing process of the array substrate is high, and the manufacturing process is also energy saving.

16 Claims, 5 Drawing Sheets

(52) U.S. Cl.
CPC .......... *H01L 27/12* (2013.01); *H01L 27/1225* (2013.01); *H01L 27/1248* (2013.01); *H01L 27/1288* (2013.01)

(56) References Cited

U.S. PATENT DOCUMENTS

2013/0175533 A1    7/2013  Lee et al.
2017/0193876 A1*  7/2017  Choi .................... G09G 3/2003

\* cited by examiner

MANUFACTURING METHODS OF ARRAY SUBSTRATES AND ARRAY SUBSTRATES

BACKGROUND OF THE INVENTION

1. Field of the Invention

The present disclosure relates to liquid crystal display technology, and more particularly to a manufacturing method of array substrates and the array substrates.

2. Discussion of the Related Art

With respect to liquid crystal panel technology, usually, the alignment of the liquid crystals are controlled by an array substrate so as to display the light beams with different grayscales. The array substrate is a key component of liquid crystal panels, and the manufacturing process of the array substrate is also very important with respect to the manufacturing process of the liquid crystal panel.

Currently, a drain and a gate are respectively deposited and etched due to the structure of the array substrate. As the drain and the gate are made by the same material, it can be understood that when the drain and the gate are respectively deposited and etched, the manufacturing efficiency may be lowered down and the manufacturing cost may be increased.

SUMMARY

The present disclosure relates to a manufacturing method of array substrates and the array substrate to enhance the manufacturing efficiency and to reduce the manufacturing cost.

In one aspect, a manufacturing method of array substrates includes: a substrate; forming a buffer layer on a substrate, and patterning the buffer layer to form trenches on the buffer layer, and the trenches correspond to a source and a data line; forming a conductive layer on the buffer layer and patterning the conductive layer to form the data line and the source within the trench, and forming a gate and a gate line on the buffer layer, wherein the buffer layer exposes at least portions of the source and the data line facing away the substrate; the gate includes a first gate and a second gate, and the first gate and the second gate are configured to be parallel to the source; forming an insulation layer on the source, the data line, the gate, and the gate line, wherein the insulation layer exposes at least portions of the source and the gate line facing away the substrate; forming a semiconductor layer on the source, wherein the semiconductor layer electrically connects to the exposed portion of the source, and the semiconductor layer and the gate are electrically insulated via the insulation layer; and forming a first pixel electrode and a second pixel electrode on the insulation layer, wherein the first pixel electrode electrically connects to one side of the semiconductor layer facing away the substrate, and the second pixel electrode electrically connects to the exposed portion of the gate line.

Wherein the gate line includes a first gate line and a second gate line, and the second pixel electrode electrically connects to the exposed portions of the first gate line and the second gate line, respectively.

Wherein the source electrically connects to the data line, and the first gate and the second gate electrically connect to the second gate line.

In another aspect, a manufacturing method of array substrates includes: a substrate; forming a buffer layer on a substrate; forming a source and a data line within the buffer layer, and forming a gate and a gate line on the buffer layer simultaneously, wherein the buffer layer exposes at least portions of the source and the data line facing away the substrate; forming an insulation layer on the source, the data line, the gate, and the gate line, wherein the insulation layer exposes at least portions of the source and the gate line facing away the substrate; forming a semiconductor layer on the source, wherein the semiconductor layer electrically connects to the exposed portion of the source, and the semiconductor layer and the gate are electrically insulated via the insulation layer; and forming a first pixel electrode and a second pixel electrode on the insulation layer, wherein the first pixel electrode electrically connects to one side of the semiconductor layer facing away the substrate, and the second pixel electrode electrically connects to the exposed portion of the gate line.

Wherein the step of forming the source and the data line within the buffer layer and forming the gate and the gate line on the buffer layer further includes: forming the buffer layer on the substrate, and patterning the buffer layer to form trenches on the buffer layer, and the trenches correspond to a source and a data line; forming a conductive layer on the buffer layer and patterning the conductive layer to form the data line and the source within the trench, and forming the gate and the gate line on the buffer layer.

Wherein the gate includes a first gate and a second gate, and the first gate and the second gate are configured to be parallel to the source.

Wherein the gate line includes a first gate line and a second gate line, and the second pixel electrode electrically connects to the exposed portions of the first gate line and the second gate line, respectively.

Wherein the source electrically connects to the data line, and the first gate and the second gate electrically connect to the second gate line.

In another aspect, an array substrate includes: a substrate; a buffer layer on the substrate; a source and a data line formed within the buffer layer, and the buffer layer exposes at least portions of the source and the data line facing away the substrate; a gate and a gate line formed on the buffer layer; an insulation layer formed on the source, the data line, the gate, and the gate line, and the insulation layer exposes at least portions of the source and the gate line facing away the substrate; a semiconductor layer formed on the source, the semiconductor layer electrically connects to the exposed portion of the source, and the semiconductor layer and the gate are electrically insulated via the insulation layer; a first pixel electrode and a second pixel electrode on the insulation layer, wherein the first pixel electrode electrically connects to one side of the semiconductor layer facing away the substrate, and the second pixel electrode electrically connects to the exposed portion of the gate line.

Wherein the buffer layer is a patterned buffer layer, and the patterned buffer layer includes trenches corresponding to the source and the data line, and the source and the data line are formed within the trenches, and the gate and the gate line are formed on the buffer layer.

Wherein the gate includes a first gate and a second gate, and the first gate and the second gate are configured to be parallel to the source.

Wherein the gate line includes a first gate line and a second gate line, and the second pixel electrode electrically connects to the exposed portions of the first gate line and the second gate line, respectively.

Wherein the source electrically connects to the data line, and the first gate and the second gate electrically connect to the second gate line.

In view of the above, the manufacturing method of the array substrates includes the steps including: forming a buffer layer on a substrate; forming a source and a data line within the buffer layer, and forming a gate and a gate line on the buffer layer, wherein the insulation layer exposes at least portions of the sides of the source and the gate line facing away the substrate; forming an insulation layer on the source, the data line, the gate, and the gate line, wherein at least a portion of the sides of the source and the gate line facing away the substrate are exposed to the insulation layer; forming a semiconductor layer on the source, wherein the semiconductor layer electrically connects to the exposed portion of the source, and the semiconductor layer and the gate are electrically insulated via the insulation layer; forming a first pixel electrode and a second pixel electrode on the insulation layer, wherein the first pixel electrode electrically connects to one side of the semiconductor layer facing away the semiconductor layer, and the second pixel electrode electrically connect to the exposed portion of the gate line. The source, the data line, the gate, and the gate line are formed simultaneously. Not only the time required for the manufacturing process is saved, but also the manufacturing efficiency is enhanced. Also, the manufacturing cost is reduced.

DETAILED DESCRIPTION OF THE EMBODIMENTS

Embodiments of the invention will now be described more fully hereinafter with reference to the accompanying drawings, in which embodiments of the invention are shown.

Figure 1:
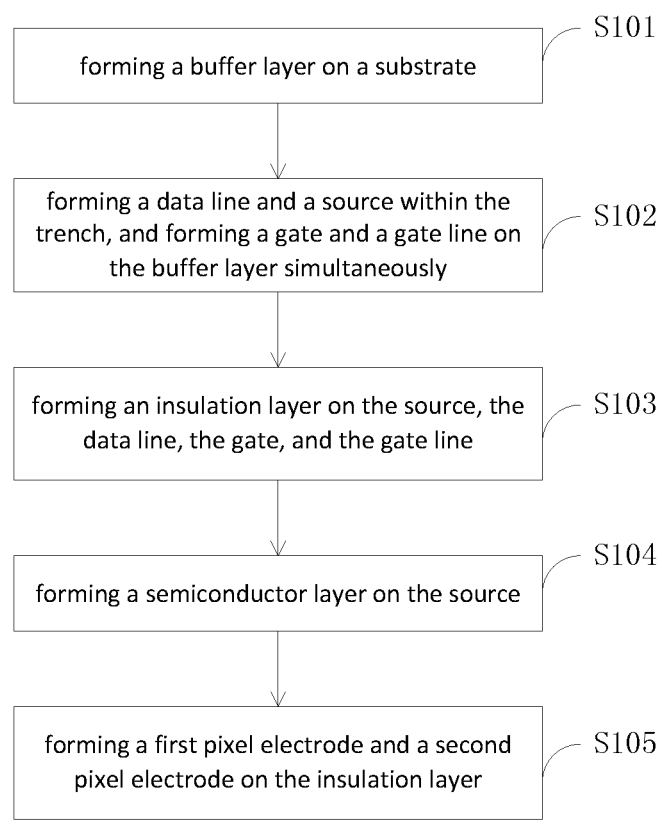
FIG. 1 is a flowchart illustrating the manufacturing method of array substrates in accordance with one embodiment.

FIG. 1 is a flowchart illustrating the manufacturing method of array substrates in accordance with one embodiment. The method includes the following steps.

In step S101, forming a buffer layer on a substrate.

Figure 2:
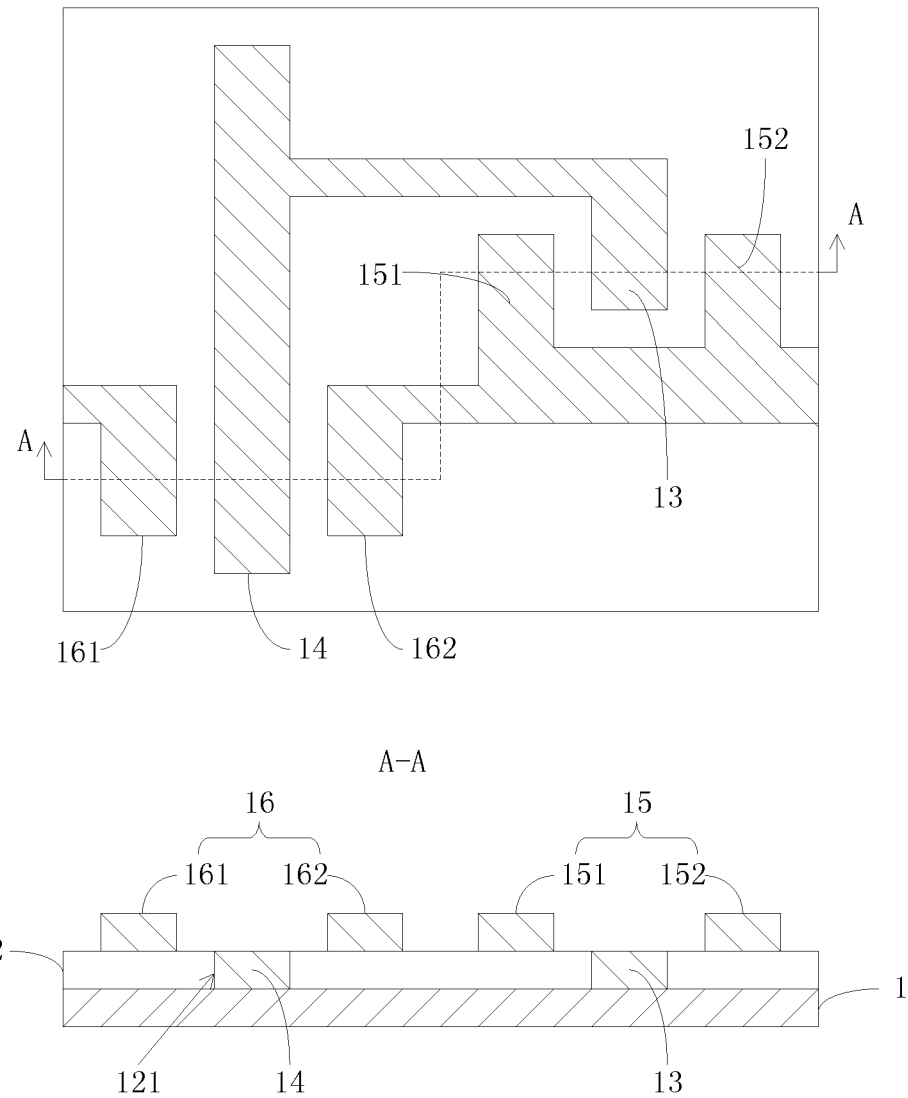
FIG. 2 is a schematic view sowing the source, the data line, the gate, and the gate line formed simultaneously by the manufacturing method of FIG. 1.

FIG. 2 is a schematic view sowing the source, the data line, the gate, and the gate line formed simultaneously by the manufacturing method of FIG. 1.

Figure 3:
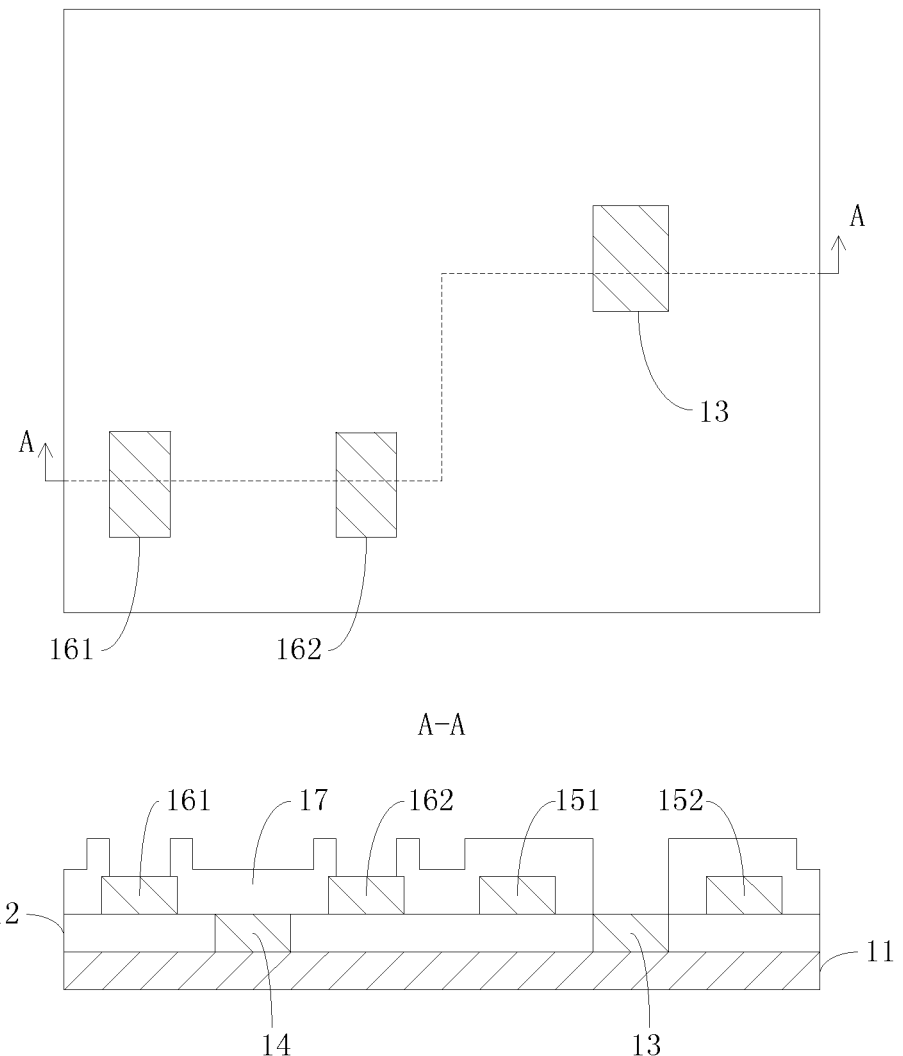
FIG. 3 is a schematic view showing the insulation layer formed by the manufacturing method of FIG. 1.
Figure 4:
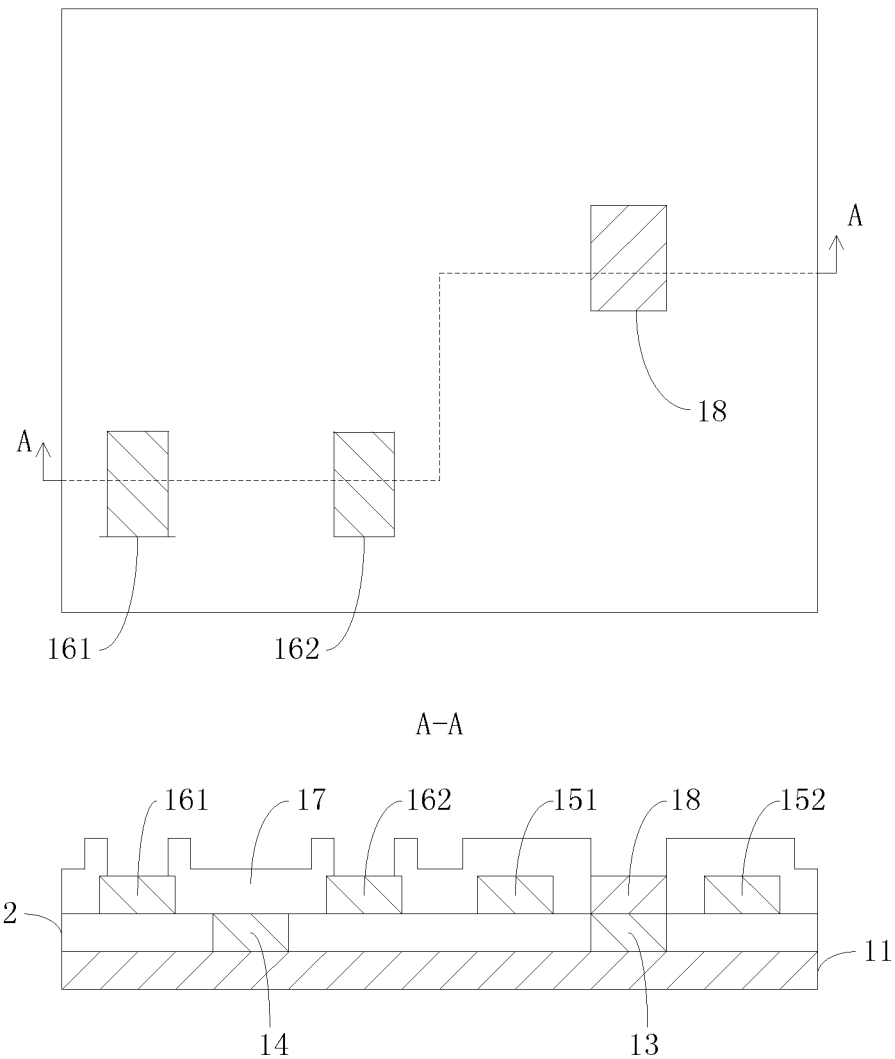
FIG. 4 is a schematic view showing the semiconductor layer formed by the manufacturing method of FIG. 1.
Figure 5:
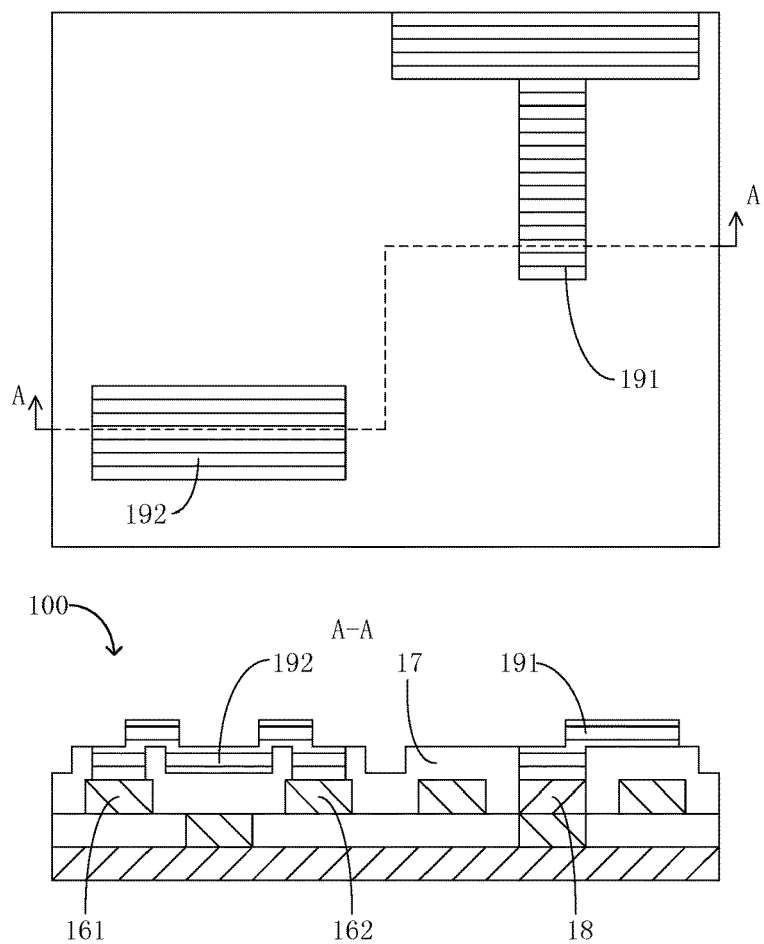
FIG. 5 is a schematic view showing the first pixel electrode and the second pixel electrode formed by the manufacturing method of FIG. 1.

The upper portion of FIG. 2 is a top view of the array substrate, and the lower portion of FIG. 2 is a cross-sectional view of the array substrate along the "A-A" direction. FIGS. 3, 4, and 5 are similar to FIG. 2, that is, the upper portion of FIGS. 3, 4 and 5 are top views, and the lower portion of FIGS. 3, 4 and 5 are cross-sectional views of the array substrate along the "A-A" direction.

In this step, the buffer layer 12 is formed on the substrate 11. The buffer layer 12 is patterned via chemical vapor deposition (CVD) and at least one masking process adopting dry etching. The patterned buffer layer 12 includes a trench 121. The trenches 121 correspond to a source 13 and a data line 14. The details will be described in accordance with step S102.

In step S102, forming a source and a data line within the buffer layer, and forming a gate and a gate line on the buffer layer.

Referring to FIG. 2, the source 13 and the data line 14 are formed within the buffer layer 12, and at least a portion of the source 13 and the data line 14 is exposed to one side of the buffer layer 12 facing away the substrate 11. That is, at least a portion of the source 13 and the data line 14 are exposed via one side of the buffer layer 12 facing away the substrate 11. When the source 13 and the data line 14 are formed, a gate 15 and a gate line 16 are formed on the buffer layer 12 simultaneously.

Specifically, in step S101, the buffer layer 12 is patterned, and the buffer layer 12 includes at least one trench 121. The source 13 and the data line 14 are formed within the trench 121, and the gate 15 and the gate line 16 are formed on the buffer layer 12.

In step S102, a conductive layer is deposited on the patterned buffer layer 12 via physical vapor deposition (PVD), and a patterning process is applied toward the conductive layer via a masking process adopting wet etching so as to form the data line 14 and the source 13 within the trench. In addition, the gate 15 and the gate line 16 are formed on the buffer layer, and the data line 14 and the source 13 are electrically connected.

The gate 15 includes a first gate 151 and a second gate 152. The gate line 16 includes a first gate line 161 and a second gate line 162, wherein the first gate 151 and the second gate 152 are parallel to the source 13, and the first gate 151 and the second gate 152 electrically connect to the second gate line 162.

In step S102, the source 13, the data line 14, the gate 15, and the gate line 16 are made by the same metallic material, and thus may be formed by the same manufacturing process. Compared to the conventional solution, i.e., adopting two manufacturing processes to respectively manufacture the source and the data line, and the gate and the gate line, the proposed solution not only saves the time required for the manufacturing process, but also conserve the cooper acid needed by the wet etching. Thus, the cost is saved and the environmental pollution may be reduced.

In step S103, forming an insulation layer on the source, the data line, the gate, and the gate line.

FIG. 3 is a schematic view showing the insulation layer formed by the manufacturing method of FIG. 1. At least a portion of the sides of the source 13 and the gate line 16 facing away the substrate 11 are exposed to the insulation layer 17 formed in the step S103.

Similarly, an insulation layer is deposited via chemical vapor deposition (CVD), and the insulation layer is patterned via at least one masking process adopting dry etching such that sides of the source 13 and the gate line 16 facing away the substrate 11 are exposed to the insulation layer 17.

In step S104, forming a semiconductor layer on the source.

FIG. 4 is a schematic view showing the semiconductor layer formed by the manufacturing method of FIG. 1. The semiconductor layer 18 formed in the step S104 electrically connects to the exposed portion of the source 13, and the semiconductor layer 18 and the gate 15 are electrically insulated via the insulation layer 17.

In step S103, the insulation layer 17 completely covers the gate 15, and thus the formed semiconductor layer 18 may be electrically insulated from the insulation layer 17. In addition, the semiconductor layer 18 may be made by the materials for the active layer, such as amorphous silicon and indium gallium zinc oxide (IGZO). In this step, the semiconductor layer 18 is formed mainly by CVD and dry etching.

In step S105, forming a first pixel electrode and a second pixel electrode on the insulation layer.

FIG. 5 is a schematic view showing the first pixel electrode and the second pixel electrode formed by the manufacturing method of FIG. 1. In step S105, a patterned pixel electrode layer is obtained by PVD and wet etching. The pixel electrode layer includes a first pixel electrode 191 and a second pixel electrode 192. After this step, the array substrate 100 is obtained.

The first pixel electrode 191 electrically connects to one side of the semiconductor layer 18 facing away the semiconductor layer 18, and the second pixel electrode 192 electrically connect to the exposed portion of the gate line 16. Specifically, the second pixel electrode 192 electrically connects to the exposed portions of the first gate line 161 and the second gate line 162, respectively. The first gate line 161 and the second gate line 162 are connected via the second pixel electrode 192.

In view of the above, the manufacturing method of the array substrates includes the steps including: forming a buffer layer on a substrate; forming a source and a data line within the buffer layer, and forming a gate and a gate line on the buffer layer, wherein the insulation layer exposes at least portions of the sides of the source and the gate line facing away the substrate; forming an insulation layer on the source, the data line, the gate, and the gate line, wherein at least a portion of the sides of the source and the gate line facing away the substrate are exposed to the insulation layer; forming a semiconductor layer on the source, wherein the semiconductor layer electrically connects to the exposed portion of the source, and the semiconductor layer and the gate are electrically insulated via the insulation layer; forming a first pixel electrode and a second pixel electrode on the insulation layer, wherein the first pixel electrode electrically connects to one side of the semiconductor layer facing away the semiconductor layer, and the second pixel electrode electrically connect to the exposed portion of the gate line. The source, the data line, the gate, and the gate line are formed simultaneously. Not only the time required for the manufacturing process is saved, but also the manufacturing efficiency is enhanced. Also, the manufacturing cost is reduced.

Figure 6:
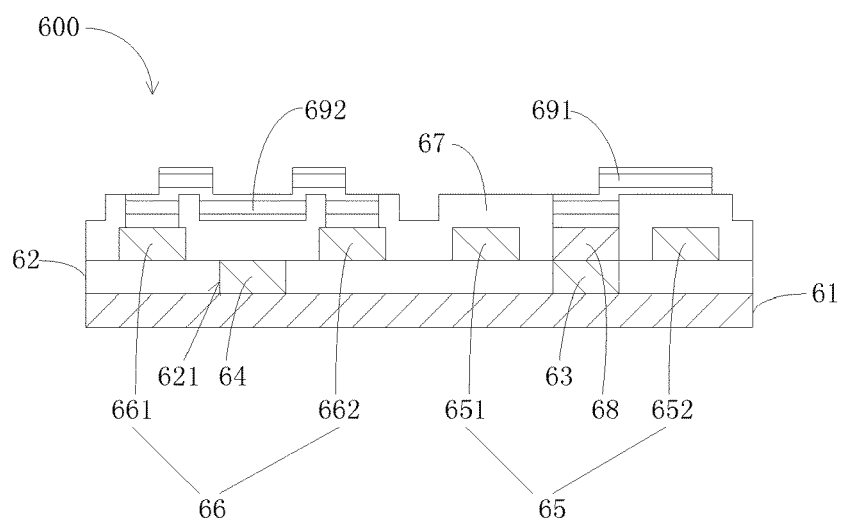
FIG. 6 is a schematic view of the array substrate in accordance with one embodiment.

FIG. 6 is a schematic view of the array substrate in accordance with one embodiment. The array substrate 600 includes a substrate 61, a buffer layer 62, a source 63, a data line 64, a gate 65, a gate line 66, an insulation layer 67, a semiconductor layer 68, a first pixel electrode 691 and a second pixel electrode 692.

The buffer layer 62 is formed on the substrate 61. The buffer layer 62 is a patterned buffer layer including at least one trench 621 corresponding to the source 63 and the data line 64.

The source 63 electrically connects to the data line 64, and the source 63 is formed within the buffer layer 62. At least portions of the buffer layer 62 expose the sides of the source 63 and the data line 64 facing away the substrate.

The gate 65 and the gate line 66 are formed on the buffer layer 62. The gate line 66 includes a first gate 651 and a second gate 652. The first gate 651 and the second gate 652 are parallel to the source 63. The gate line 66 includes a first gate line 661 and a second gate line 662. The first gate 651 and the second gate 652 electrically connects to the second gate line 662.

The insulation layer 67 is formed on the source 63, the data line 64, the gate 65, and the gate line 66. The insulation layer 67 exposes at least portions of the source 63 and the gate line 66 facing away the substrate 61.

The semiconductor layer 68 is formed on the source 63. The semiconductor layer 68 electrically connects to the exposed portion of the source 63, and the semiconductor layer 68 and the gate 65 are electrically insulated via the insulation layer 67.

The first pixel electrode 691 and the second pixel electrode 692 are formed on the insulation layer 67, wherein the first pixel electrode 691 electrically connects to one side of the semiconductor layer 68 facing away the substrate 61, and the second pixel electrode 692 electrically connects to the exposed portion of the gate line 66. The second pixel electrode 692 electrically connects to the exposed portions of the first gate line 661 and the second gate line 662, respectively.

The array substrate 600 may be made by the manufacturing method similar to that with respect to the array substrate 100. The source, the data line, the gate, and the gate line are formed simultaneously due to the structure of the array substrate. Thus, the manufacturing efficiency of the array substrate is enhanced, and the cost is low.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of array substrates, comprising:
    forming a buffer layer on a substrate, and patterning the buffer layer to form trenches defined within the patterned buffer layer;
    forming a conductive layer on the patterned buffer layer and the trenches, and patterning the conductive layer such that portions of the patterned conductive layer within the trenches are used as a data line and a source respectively, and portions of the patterned conductive layer on the patterned buffer layer are used as a gate and a gate line respectively;
    forming an insulation layer on the source, the data line, the gate, and the gate line, wherein at least one portion of the source and at least one portion of the gate line are exposed by the insulation layer;
    forming a semiconductor layer on the source, wherein the semiconductor layer is electrically connected to the exposed portion of the source, and the semiconductor layer and the gate are electrically insulated via the insulation layer; and
    forming a first pixel electrode and a second pixel electrode on the insulation layer, wherein the first pixel electrode is electrically connected to the semiconductor layer, and the second pixel electrode is electrically connected to the exposed portion of the gate line,
    wherein the gate comprises a first gate electrode and a second gate electrode, and the first gate electrode and the second gate electrode are configured to be located at two sides of the source and be parallel to the source.

2. The manufacturing method as claimed in claim 1, wherein the gate line comprises a first gate line and a second gate line, and the second pixel electrode is electrically connected to both the exposed portion of the first gate line and the exposed portion of the second gate line.

3. The manufacturing method as claimed in claim 2, wherein the source is electrically connected to the data line, and the first gate and the second gate are electrically connected to the second gate line.

4. The manufacturing method as claimed in claim 2, wherein the first gate line and the second gate line are configured to be located at two sides of the data line.

5. The manufacturing method as claimed in claim 1, wherein the data line and the source within the trenches and the gate and the gate line on the patterned buffer layer are formed simultaneously.

6. The manufacturing method as claimed in claim 1, wherein each of the trenches are defined between every two adjacent patterned portion of the patterned buffer layers.

7. A manufacturing method of array substrates, comprising:
    forming a buffer layer on a substrate;
    forming a source and a data line within the buffer layer and a gate and a gate line on the buffer layer simultaneously, wherein at least one portion of the source and at least portion of the data line are exposed by the buffer layer;
    forming an insulation layer on the source, the data line, the gate, and the gate line, wherein both at least one portion of the source and at least one portion of the gate line are exposed by the insulation layer;
    forming a semiconductor layer on the source, wherein the semiconductor layer is electrically connected to the exposed portion of the source, and the semiconductor layer and the gate are electrically insulated via the insulation layer; and
    forming a first pixel electrode and a second pixel electrode on the insulation layer, wherein the first pixel electrode is electrically connected to the semiconductor layer, and the second pixel electrode is electrically connected to the exposed portion of the gate line,
    wherein the gate comprises a first gate and a second gate, and the first gate and the second gate are configured to be located at two sides of the source and be parallel to the source.

8. The manufacturing method as claimed in claim 7, wherein the step of forming the source and the data line within the buffer layer and the gate and the gate line on the patterned buffer layer further comprises:
    forming the buffer layer to form trenches defined within the patterned buffer layer; and
    forming a conductive layer on the buffer layer and the trenches, and patterning the conductive layer such that portions of the patterned conductive layer within the trenches are a data line and a source respectively, and portions of the patterned conductive layer on the patterned buffer layer are a gate and a gate line respectively.

9. The manufacturing method as claimed in claim 7, wherein the gate line comprises a first gate line and a second gate line, and the second pixel electrode is electrically connected to both the exposed portion of the first gate line and the exposed portion of the second gate line.

10. The manufacturing method as claimed in claim 9, wherein the source is electrically connected to the data line, and the first gate and the second gate are electrically connected to the second gate line.

11. The manufacturing method as claimed in claim 9, wherein the first gate line and a second gate line are configured to be located at two sides of the data line.

12. An array substrate, comprising:
    a substrate;
    a buffer layer on the substrate, and trenches defined by patterning the buffer layer, wherein the trenches is be located within the patterned buffer layer;
    a source and a data line formed within the trenches, and a gate and a gate line formed on the patterned buffer layer, wherein at least one portion of the source and at least portion of the data line are exposed by the patterned buffer layer;
    an insulation layer formed on the source, the data line, the gate, and the gate line, wherein both at least one portion of the source and at least one portion of the gate line are exposed by the insulation layer;
    a semiconductor layer formed on the source, wherein the semiconductor layer is electrically connected to the exposed portion of the source, and the semiconductor layer and the gate are electrically insulated via the insulation layer;
    a first pixel electrode and a second pixel electrode on the insulation layer, wherein the first pixel electrode is electrically connected to the semiconductor layer, and the second pixel electrode is electrically connected to the exposed portion of the gate line,
    wherein the gate comprises a first gate and a second gate, and the first gate and the second gate are configured to be located at two sides of the source and be parallel to the source.

13. The array substrate as claimed in claim 12, wherein the gate line comprises a first gate line and a second gate line, and the second pixel electrode is electrically connected to both the exposed portion of the first gate line and the exposed portion of the second gate line.

14. The array substrate as claimed in claim 13, wherein the source is electrically connected to the data line, and the first gate and the second gate are electrically connected to the second gate line.

15. The array substrate as claimed in claim 13, wherein the first gate line and are second gate line are configured to be located at two sides of the data line.

16. The array substrate as claimed in claim 12, wherein the data line and the source within the trenches and the gate and the gate line on the patterned buffer layer are formed simultaneously.

* * * * *